United States Patent
Nayfeh et al.

(10) Patent No.: US 6,410,934 B1
(45) Date of Patent: Jun. 25, 2002

(54) SILICON NANOPARTICLE ELECTRONIC SWITCHES

(75) Inventors: Munir H. Nayfeh; Joel Therrien; Adam D. Smith, all of Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/781,147

(22) Filed: Feb. 9, 2001

(51) Int. Cl.$^7$ ................................. H01L 29/06
(52) U.S. Cl. ................. 257/14; 257/17; 257/30; 257/39
(58) Field of Search ................. 257/14, 17, 30, 257/37, 39

(56) References Cited

U.S. PATENT DOCUMENTS

| | | | |
|---|---|---|---|
| 4,931,692 A | 6/1990 | Takagi et al. | |
| 5,308,804 A | 5/1994 | Lee | 501/17 |
| 5,527,386 A | 6/1996 | Statz | 106/481 |
| 5,561,679 A | 10/1996 | Mannik et al. | 372/43 |
| 5,690,807 A | 11/1997 | Clark, Jr. et al. | 205/655 |
| 5,695,617 A | 12/1997 | Graiver et al. | 204/157.41 |
| 5,714,766 A | 2/1998 | Chen et al. | |
| 5,747,180 A | 5/1998 | Miller et al. | |
| 5,770,022 A | 6/1998 | Chang et al. | 204/164 |
| 5,891,548 A | 4/1999 | Graiver et al. | 428/98 |
| 5,906,671 A * | 5/1999 | Dobson et al. | 75/370 |
| 5,932,889 A | 8/1999 | Matsumura et al. | |
| 5,942,748 A | 8/1999 | Russell et al. | 250/214.1 |
| 6,060,743 A | 5/2000 | Sugiyama et al. | 257/321 |
| 6,326,311 B1 * | 12/2001 | Ueda et al. | 438/694 |

OTHER PUBLICATIONS

U.S. Patent Application Nayfeh et al., Serial No. 09/496,506 entitled Silicon Nanoparticle Field Effect Transistor and Transistor Memory Device, filed on Feb. 2, 2000.

U.S. Patent Application Nayfeh et al., Serial No. 09/426,204 entitled Silicon Nanoparticle Stimulated Emission Devices, filed on Oct. 25, 1999.

U.S. Patent Application Nayfeh et al., Serial No. 09/426,389 entitled Silicon Nanoparticle and Method For Producing The Same, filed Oct. 22, 1999.

Sandip Tiwari, Farhan Rana, Hussein Hanafi, Allan Hartstein, Emmanuel F. Crabbé, and Kevin Chan, "A silicon nanocrystals based memory", Appl. Phys. Lett., vol. 68, No. 10, Mar. 4, 1996, pp. 1377–1379.

G.M. Credo, M.D. Mason, and S.K. Buratto, "External quantum efficiency of single porous silicon nanoparticles", Applied Physics Letters, vol. 74, No. 14, Apr. 5, 1999, pp. 1978–1980.

J. Erland, P. Yu, S.I. Bozhevolnyi, J.M. Hvam, N.N. Ledentsov, "Second harmonic spectroscopy of semiconductor nanostructures", Quantum Electronics and Laser Science Conference Technical Digest, May 1999, pp. 233–234.

L. Pavesl, L. Dal Negro, C. Mazzoleni, G. Franzo and F. Prlolo, "Optical gain in silicon nanocrystals", Nature, vol. 408, Nov. 23, 2000, pp. 440–443.

(List continued on next page.)

Primary Examiner—Sara Crane
(74) Attorney, Agent, or Firm—Greer, Burns & Crain, Ltd.

(57) ABSTRACT

An electronic fast switch for operation at room temperature utilizing uniform silicon nanoparticles (~1 nm with about 1 part per thousand exceeding 1 nm) between two conducting electrodes. The silicon nanoparticles, when on an n-type silicon substrate exhibit, at zero bias, a large differential conductance, approaching near full transparency. The conductance is observed after one of the electrode is first biased at a voltage in the range 3 to 5 eV (switching voltage), otherwise the device does not conduct (closed). A practical MOSFET switch of the invention includes the silicon nanoparticles in a body of the MOSFET, with the gate and substrate forming the two conducting electrodes. Electrodes may be realized by metal in other switches of the invention.

5 Claims, 8 Drawing Sheets

OTHER PUBLICATIONS

D.J. DiMaria, J.R. Kirtley, E.J. Pakulis, D.W. Dong. T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401–416.

S. Juen, K. Überbacher, J. Baldauf, K.F. Lamprecht, R. Tessadri, R. Lackner, R. A. Höpfel, "Technology and Photoluminescence of GaAs Micro– and Nanocrystallites", Superlattices and Microstructures, vol. 11, No. 2, 1992, pp. 181–184.

K.A. Littau, P.J. Szajowski, A.J. Muller, A.R. Kortan, and L.E. Brus, "A Luminescent Silicon Nanocrystal Colloid via a High–Temperature Aerosol Reaction", The Journal of Physical Chemistry, vol. 97, No. 6, 1993, pp. 1224–1230.

Anton Fojtik, Arnim Henglein, "Luminescent colloidal silicon particles", Chemical Physics Letters 221, Apr. 29, 1994, pp. 363–367.

L.A Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994.

Xinwei Zhao, Olaf Schoenfeld, Jun–ichi Kusano, Yoshinobu Aoyagi and Takuo Sugano, "Observation of Direct Transitions in Silicon Nanocrystallites", Jpn. J. Appl. Phys., vol. 33, Jul. 1, 1994, Pt. 2, No. 7A, pp. L899–L901.

Shoutian Li, I.N. Germanenko, M.S. El Shall, "Semiconductor nanoparticles in contact: quenching of the photoluminescence from silicon nanocrystals by WO3 nanoparticles suspended in solution", Journal of Physical Chemistry B, vol. 102, No. 38, pp. 7319–7322, Sep. 17, 1998 (Abstract).

S. T. Yau, D. Saltz, M. H. Nayfeh, "Laser–Assisted Deposition of Nanometer Structures Using a Scanning Tunneling Microscope", Appl. Phys. Lett., vol. 57, No. 27, Dec. 31, 1990, pp. 2913–2915.

S.T. Yau, X. Zheng, M.H. Nayfeh, "Nanolithography of Chemically Prepared Si With a Scanning Tunneling Microscope", Appl. Phys. Lett., vol. 59, No. 19, Nov. 4, 1991, pp. 2457–2459.

M, Nayfeh, "Fabrication of Nanometer Scale Structures", SPIE Institutes, vol. IS 10, (1993), pp. 200–217.

D. Andsager, J. Hilliard, J.M. Hetrick, L.H. AbuHassan, M. Plisch, M.H. Nayfeh, "Quenching of Porous Silicon Photoluminescence by Deposition of Metal Adsorbates", J. Appl Phys., vol. 74, No. 7, Oct. 1, 1993, pp. 4783–4785.

J. Hilliard, D. Andsager, L. Abu Hassan, H.M. Nayfeh, M. H. Nayfeh, "Infrared Spectroscopy and Secondary Ion Mass Spectrometry of Luminescent, Nonluminescent and Metal Quenched Porous Silicon", J. Appl. Phys., vol. 76, No. 4, Aug. 15, 1994, pp. 2423–2427.

D. Andsager, J. Hilliard, M.H. Nayfeh, "Behavior of Porous Silicon Emission Spectra During Quenching by Immersion in Metal Ion Solutions", Appl. Phys. Lett., vol. 64, No. 9, Feb. 28, 1994, pp. 1141–1143.

D. Andsager, J.M. Hetrick, J. Hillard, M.H. Nayfeh, "Diffusion of Copper in Porous Silicon", J. Appl. Phys., vol. 77, No. 9, May 1, 1995, pp. 1–4.

J.E. Hilliard, H.M. Nayfeh, M.H. Nayfeh, "Re–Establishment of Photoluminescence in Cu Quenched Porous Silicon by Acid Treatment", J. App. Phys., vol. 77, No. 8, Apr. 15, 1995, pp. 4130–4132.

N. Rigakis, J. Hilliard, L. Abu Hassan, J. Hetrick, D. Andsager, M.H. Nayfeh, "Effect of Oxidation Treatments on Photoluminescence Excitation of Porous Silicon", J. App. Phys., vol. 81, No. 8, Jan. 1, 1997, pp. 440–444.

N. Rigakis, Z. Yamani, L. Abu Hassan, J. Hilliard, M.H. Nayfeh, "Time–Resolved Measurements of the Photoluminescence of Cu–Quenched Porous Silicon", Appl. Phys. Lett., vol. 69, 1996, pp. 2216–2218.

W.H. Thompson, Z. Yamani, L.H. Abu Hassan, J.E. Greene, M. Nayfeh, "Room Temperature Oxidation Enhancement of Porous Si(001) Using Ultraviolet–Ozone Exposure", J. Appl. Phys., vol. 80, No. 9, Nov. 1, 1996, pp. 5415–5421.

Z. Yamani, W.H. Thompson, L. Abu Hassan, M.H. Nayfeh, "Ideal Anodization of Silicon", Appl. Phys. Lett., vol. 70, No. 25, Jun. 23, 1997, pp. 3404–3406.

M. H. Nayfeh, N. Rigakis, Z. Yamani, "Photoexcitation of Si–Si Surface States in Nanocrystallites", Physical Review B, vol. 56, No. 4, Jul. 15, 1997, pp. 2079–2084.

Z. Yamani, S. Ashhab, A. Nayfeh, W.H. Thompson, M. Nayfeh, "Red to Green Rainbow Photoluminescence from Unoxidized Silicon Nanocrystallites", J. Appl. Phys., vol. 83, No. 7, Apr. 1, 1998, pp. 3929–3931.

Z. Yamani, N. Rigakis, M.H. Nayfeh, "Excitation of Size Selected Nanocrystallites in Porous Silicon", Appl. Phys. Lett., vol. 72, No. 20, May 18, 1998, pp. 2556–2558.

W.H. Thompson. Z. Yamani, L. Abu Hassan, O. Gurdal, M. Nayfeh, "The Effect of Ultrathin Oxides on Luminescent Silicon Nanocrystallites", Appl. Phys. Lett., vol. 73, No. 6, Aug. 10, 1998, pp. 841–843.

M.H. Nayfeh, N. Rigakis, Z. Yamani, "Photoexcitation of Si–Si Radiative Surface States in Nanocrystallites" Mat. Res. Soc. Symp. Proc., vol. 486, 1998, pp. 243–248.

M.H. Nayfeh, Z. Yamani, O. Gurdal, A. Alaql, "Nanostructure of Porous Silicon Using Transmission Microscopy", Mat. Res. Soc. Symp. Proc., vol. 536, 1999 Proc.

Z. Yamani, A. Alaql, J. Therrien, O. Nayfeh, M. Nayfeh, "Revival of Interband Crystallite Reflectance from Nano–crystallites in Porous Silicon by Immersion Plating", Appl. Phys. Lett., vol. 74, No. 23, Jun. 7, 1999, pp. 3483–3485.

Z. Yamani, O. Gurdal, A. Alaql, M.H. Nayfeh, "Correlation of Diffuse Scattering with Nanocrystallite Size in Porous Silicon Using Transmission Microscopy", J. Appl. Phys., vol. 85, Nov. 12, Jun. 15, 1999, pp. 8050–8053.

L.T. Canham, "Silicon Quantum Wire Array Fabrication by Electrochemical and Chemical Dissolution of Wafers", Appl. Phys. Lett., vol. 57, No. 10, Sep. 3, 1990, pp. 1046–1048.

A.G. Cullis, L.T. Canham, P.D.J. Calcott, "The Structural and Luminescence Properties of Porous Silicon", J. Appl. Phys., vol. 82, No. 3, Aug. 1, 1997, pp. 909–965.

J. Wang, H.B. Jiang, W.C. Wang, J.B. Zheng, F.L. Zhang, P.H. Hao, X.Y Hou, X. Wang, "Efficient Infrared–Up–Conversion Luminescence in Porous Silicon: A Quantum–Confinement–Induced Effect", Phys. Rev. Lett., vol. 69, No. Nov. 30, 1992, pp. 3252–3255.

J. Gole, D. Dixon, "Evidence for Oxide Formation from the Single and Multiphoton Excitation of a Porous Silicon Surface or Silicon 'Nanoparticles'", J. Appl. Phys., vol. 83, No. 11, Jun. 1, 1998, pp. 5985–5991.

F. Koch, "Models and Mechanisms for the Luminescence of Porous Si", Mater. Res. Soc. Symp. Proc., vol. 298, 1993, pp. 319–329.

R.P. Chin, Y.R. Shen, V. Petrova–Koch, "Photoluminescence from Porous Silicon by Infrared Multiphoton Excitation" *Science,* vol. 270, Nov. 3, 1995, pp. 776–778.

S.I. Raider, R. Flitsch, M.J. Palmer, "Oxide Growth on Etched Silicon in Air at Room Temperature", *J. Electrochem. Soc.,* vol. 122, No. 3, Mar. 1975, pp. 413–418.

U. Neuwald, A. Feltz, U. Memmert, R.J. Behm, "Chemical Oxidation of Hydrogen Passivated Si(111) Surfaces in $H_2O_2$", *J. Appl. Phys.,* vol. 78, No. 6, Sep. 15, 1995, pp. 4131–4136.

A. Pasquarello, M.S. Hybertsen, R. Car, "Si 2p Core–Level Shifts at the Si(001)–$SiO_2$ Interface: A First–Principles Study", *Phys. Rev. Lett.,* vol. 74, No. 6, Feb. 6, 1995, pp. 1024–1027.

M.H. Nayfeh, N. Rigakis, Z. Yamani, "Photoexcitation of Si–Si Radiative Surface States in Nanocrystallites", Mat. Res. Soc. Symp. Proc., vol. 486, pp. 243–248.

Z. Yamani, A. Alaql, J. Therrien, O. Nayfeh, M. Nayfeh, "Revival of Interband Crystalline Reflectance from Nano–crystallites in Porous Silicon by Immersion Plating", *Appl. Phys. Lett.,* vol. 74, No. 23, Jun. 7, 1999, pp. 3483–3485.

E. Hanamura, "Very Large Optical Nonlinearity of Semiconductor Microcrystallites", *Physical Rev. B,* vol. 37, No. 3, Jan. 15, 1988, pp. 1273–1279.

G. Allan, C. Delerue, M. Lannoo, "Nature of Luminescent Surface States of Semiconductor Nanocrystallites", *Physical Rev. Lett.,* vol. 76, No. 16, Apr. 15, 1996, pp. 2961–2964.

E. Werwa, A.A. Seraphin and K.D. Kolenbrander, Excitation Intensity and Temperature Dependent Photoluminescence Behavior of Silicon Nanoparticles, Material Research Society Symposium Proceedings, vol. 452 pp. 129–134, 1997.

R.W. Collins, P.M. Fauchet, I. Shimizu, J.C. Vial, T. Shimada and A.P. Alivisatos, Luminescence Properties of Silicon Nanocrystals, Advances in Microcrystalline and Nanocrystaline Semiconductor Symposium, Boston, MA, USA, Dec. 2–6, 1996 (abstract).

Shoutian Li, Stuart J. Silvers and M. Samy El–Shall, Luminescence Properties of Silicon Nanocrystals, Material Research Society Symposium Proceedings, vol. 452, pp. 141–146, 1997.

Kouichi Murakami and Tetsuya Makimura, Silicon nanoparticles with visible light emission—Laser ablation–, Oyo Buturi, vol. 67, No. 7, pp. 817–821, Jul. 1998 (with verified translation).

J.L. Heinrich, C.L. Curtis, G.M. Credo, K.L. Kavanagh, M.J. Sailor, "Luminescent Colloidal Silicon Suspensions from Porous Silicon", *Science,* vol. 255, Jan. 3, 1992, pp. 66–68.

U.S. Pat. Application Nayfeh et al., Ser. No. 09/572,121 entitled Silicon Nanoparticle Microcrystalline Nonlinear Optical Devices, filed on May 17, 2000.

* cited by examiner

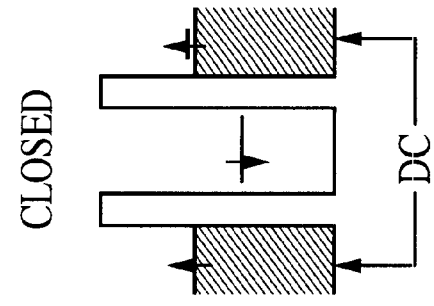
FIG. 5(c) CLOSED
ZERO DC VOLTAGE WITH FLOW
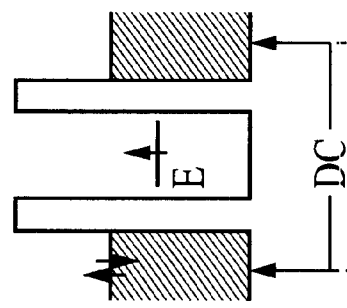
FIG. 5(b)
FAST PULSE (SHORT) TO POPULATE PARTICLE WELL ≥3.1V
NO FLOW
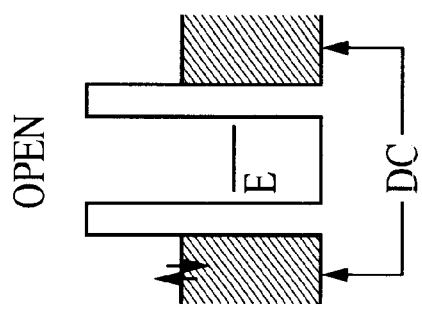
FIG. 5(a) OPEN
NO FLOW

SILICON NANOPARTICLE ELECTRONIC SWITCHES

REFERENCE TO RELATED APPLICATIONS

This application is related to and incorporates by reference the following prior co-pending applications to Nayfeh et al:

Ser. No. 09/426,389, entitled SILICON NANOPARTICLES AND METHOD FOR PRODUCING THE SAME, filed on Oct. 22, 1999;

Ser. No. 09/496,506, filed on Feb. 2, 2000, entitled SILICON NANOPARTICLES FIELD EFFECT TRANSISTOR AND TRANSISTOR MEMORY DEVICE.

Another commonly owned application concerning silicon nanoparticles is the application to Nayfeh et al., Ser. No. 09/426,204, entitled SILICON NANOPARTICLE STIMULATED EMISSION DEVICES, filed on Oct. 25, 1999. Still another commonly owned application concerning silicon nanoparticles is the application to Nayfeh et al. Ser. No. 09/572,121, filed on May 17, 2000 and entitled SILICON NANOPARTICLE MICROCRYSTAL NONLINEAR OPTICAL DEVICES.

FIELD OF THE INVENTION

The present invention is in the electronic single electron switching field in which device operation is based on one-by-one transport of electrons through a small substructure. According to the invention, high temperature (higher than room temperature) single electron electronic switches have been operated. No such capability has been previously demonstrated, and is produced in the invention through a new class of material, referred to herein as silicon nanoparticles.

BACKGROUND OF THE INVENTION

The switch is one of the most important components of any electrical system. Electrically, the switch is a two-state device. It is either ON or OFF. An ideal switch offers no resistance to current when it is in the on state, but it offers infinite resistance to current when it is in the off state. These two states represent the limiting values of a resistor. The ON state corresponds to a resistor with a numerical value of zero, and the OFF state corresponds to a resistor with a numerical value of infinity. Transistors presently used as switching devices provide some resistance to current flow in the ON state.

A quantum well can act as a very sensitive switch. FIG. 1a represents a quantum well device by a well connected to two sources of electrons A and B via a barrier on each side. The frames in FIGS. 1a–1b and FIG. 2 describe the I–V characteristics for the quantum well device. With zero voltage between points A and B (FIG. 1a), the quantum well presents a barrier to the n-carriers. There is no tunneling because the energy levels on both sides of the quantum well are occupied equally. When a voltage is applied, the n-carriers on the left are at a higher energy (FIGS. 1b–d), and they can tunnel into empty levels. Thus, the current rises with V, as shown in FIG. 2. When the bottom of the conduction band on the left is lifted high enough to match one of the low lying quantized levels inside the well, there is a drastic increase in the flow of current. A further voltage rise decreases the current, because the bottom of the conduction band on the left no longer matches a well level. As the voltage is increases further, the current decreases and then increases again as the second energy level is approached. The effect is very similar to the resonant behavior that occurs when the frequency of a harmonic driving force matches the characteristic frequency of a slightly damped harmonic oscillator. The resonance makes for a sensitive switch.

Electronic devices and circuits are getting smaller and smaller. Such devices are required to work faster and consume and dissipate less energy. The goal is to attain single electron devices to reduce the impedance of a switch in the on state, to decrease response time, and to decrease power consumption. In single electronics (single electron technology), device operation is based on the concept of one carrier for one bit of information. In August, 1991 Eigler announced the simplest and probably the smallest switch that it is possible to make (Nature, vol. 352, p 600). The on and off states of his atomic switch rely on the position of a single Xenon atom. The atom can be switched between two stable positions representing ON and OFF. One position is in a kink on the surface of a crystal of nickel, the other is on the tip of a STM (scanning tunneling microscope) held still just a few atomic diameters above the surface. By applying a short pulsed voltage to the tip, Eigler could make the Xenon atom jump across the gap from the surface to the tip. A pulse in the other direction made the atom jump back down onto the surface. While the atom switch is a good demonstration of what is possible with an STM, it is unlikely ever to form a useful device. The Xenon atom is held onto the surface only by very weak chemical bonds. This means that the whole process has to take place at temperatures as low as 4° Kelvin so that thermal vibrations do not bounce the Xenon around, and in a vacuum so that gas molecules do not disturb it. This makes the whole apparatus very bulky. Modern semiconductor chips cram millions of switches into an area less than a centimeter square and must be durable enough to survive in a electronic devices used in everyday electronic application environments. Obviously, Eigler's STM single atom switch is unsuitable for such applications.

An alternative to a single atom switch is one that relies on a single electron. American researchers made such a transistor several years ago, employing techniques used to make advanced semiconductor chips. Robert Jaklevic, however, has built a single electron device incorporating an STM tip similar to the way Eigler used a tip as one of the electrodes of his atomic switch. Jaklevic, of the Ford Motor Company's Scientific Laboratory in Dearborn, Mich., was working with colleagues from the University of Michigan at Ann Arbor. Jaklevic's team took a semiconductor substrate coated with a thin layer of an insulating material and sprayed minute blobs of indium onto it. It then used the STM tip to locate one of the tiny blobs and positioned the tip over it. By manipulating the voltages applied to the tip and the substrate, the researchers can control the movement of single electrons in and out of the blob.

In the last two years, it has been expressed that the physics of a quantum dot (particle, or well) connected to leads is similar to the physics of a magnetic impurity in a metal host. In the process, an electron in the impurity (or the quantum dot) couples to an electron in the metal host (or electrode) to form a bound singlet magnetic electron state. The Anderson treatment of the problem simply models it, in essence, as a discrete-continuum (band) coupling, i.e., the discrete energy levels of an impurity or those of a quantum dot couple to a continuum of states of a conductor. One dramatic manifestation of the process is that the electronic transport through the impurity or dot exhibits, below a certain temperature (Knodo temperature $T_k$), strong conductance enhancement and even perfect transparency (switching action) near zero bias if it is symmetrically coupled to the conductor or leads. The temperature $T_k$ is defined as $T_k = (U*)\frac{1}{2}e-*(*-*)/2 *$ where $U=e2/C$ is the single electron charging and C is the capacitance of the particle, $* = *1 = *2$ is the coupling of the dot to the leads as a tunneling rate of electrons, $*$ is the electronic energy in the quantum dot, and $*$ is the chemical potential energy of the leads at equilibrium.

Due to the magnetic nature of the process, the conductance is maintained in the presence of a magnetic field but gets split into two energy conductance channels, slightly shifted above and below zero biasing. Another system which was recently shown to exhibit the Kondo effect is electron charge trap state. The charge traps are created in a dielectric such as $Si_3N_4$ by field breakdown, while the dielectric is sandwiched in the metal by advance nanolithography.

Although the coupling between a magnetic impurity and a conduction-electron sea, as in the Kondo effect in a magnetic impurity in a host metal, has been the focus of condensed matter research for many years, only in the last two years experiments have been conducted on the analogous problem of a quantum dot connected to two leads. The binding energy of the magnetic singlet state is expected to be small for quantum dots since the electrons in the lead and the quantum dot are separated by a large distance, and thermal agitation will suppress the process at any temperature. Only recently have advances in fabrication made it possible to fabricate small enough quantum structures that permit the singlet state to be stabilized at finite temperatures.

For example, the Kondo process has been observed in the electronic transport between the source and the drain of a sub micron single-electron transistor (SET) that is constructed from GaAs/AlGaAs material by Van der Vaat et al., Physical Review Letters 74,4702. (1995). The quantum dot in the device is a sheet of electrons (two dimensional electron gas) of approximately 150 nm×150 nm, containing ~40 electrons. Those are confined at the GaAs/AlGaAs heterostructure interface. With this structure all of the Kondo-like physics have been observed including the electronic transparency and the magnetic properties, but only at temperatures below 1 degree Kelvin.

More recently, advances in down scaling of Si based transistors opened the way for similar studies to be conducted on silicon based FET devices. The electron gas in the silicon case is confined at the $Si—SiO_2$ interface by applying a voltage to the gate electrode. The enhancement in the differential conductance at zero bias was observed. However, it was not clear if this was due to a Kondo effect. Unlike the GaAs/AlGaAs system, the conductance did not show the characteristic magnetic features. An imposed magnetic field tends, in general, to destroy the conductance instead of just splitting it into two energy channels.

Quantum dots made of an electron gas confined at the interface of heterostructures as in transistor systems have certainly provided a means to observe the Kondo effect. However, characteristic sizes of such structures are limited to 100 nm, limiting the temperature below which the singlet magnetic state may be bound to sub one degree Kelvin (several hundred milli Kelvin). Moreover, the electron gas involves a few dozen electrons, with confinement in one dimension only. As a result, switching via the Kondo effect has remained in the realm of low temperature physics.

To bring the switching effect to the realm of room temperature, real topographical ultrasmall quantum particles or dots with large U, (small C), and strong $*\sim(*-*)$ must be used. Such particles are provided in the present invention. The particles are the basis for a switch that provides a single electron transparency and fast switching operation at room temperature.

SUMMARY OF THE INVENTION

The present invention relies upon a previously unknown material, uniform silicon nanoparticles dimensioned at 1 nm (about 1 part per thousand being of greater dimension). This new material and a method for making the same are described in copending application Ser. No. 09/426,389, to Nayfeh et al. entitled SILICON NANOPARTICLES AND METHOD OF MAKING THE SAME. That application is incorporated by reference herein. The silicon nanoparticles have a discrete set of states resulting from the quantum mechanical wave-like nature of electrons, capable of capturing/emission single charge carriers. For a given material, the energy amount is the basic unit $E=3h^2/8\ md^2$, where m is the mass of an electron, h is Planck's constant, and d is the diameter of the particle. For the particles of the invention, d~1 nm, providing an energy spacing of 1 electron volt.

This energy spacing extends single electron switch properties beyond the low temperature process demonstrated in the prior art. We have demonstrated an electronic fast switch for operation at room temperature utilizing the silicon nanoparticles sandwiched between two conducting electrodes. The silicon nanoparticles, when on an n-type silicon substrate exhibit, at zero bias, a large differential conductance, approaching near full transparency. The conductance is observed after one of the electrode is first biased at a voltage larger than 3.1 eV (switching voltage), otherwise the device does not conduct (closed).

BRIEF DESCRIPTION OF THE DRAWINGS

Other features, objects, and advantages of the invention will be apparent by reference to the detailed description and the drawings, of which:

FIGS. 5a–5c illustrate a sequence of the operation of the switch of the invention. FIG. 5a shows the open state, FIG. 5b an activated state prepared by an electric pulse, and FIG. 5c a closed state with flow;

FIG. 6 shows the response for a prototype switch of the invention switch using an n-type silicon substrate after the application of an activation voltage pulse.

DETAILED DESCRIPTION OF THE INVENTION

Figure 1:
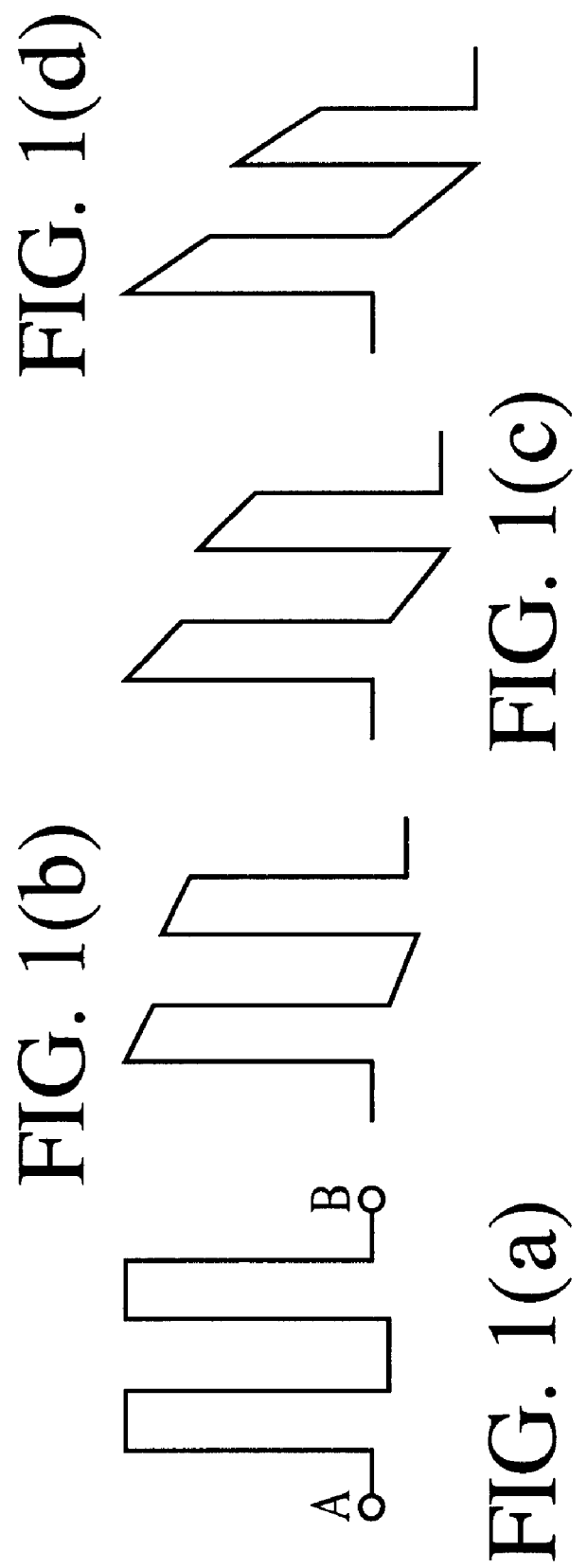
FIGS. 1a–1d illustrate a traditional single electron quantum well switch by the energy level diagram of the electronic states with increasing electric field imposed on the well.
Figure 2:
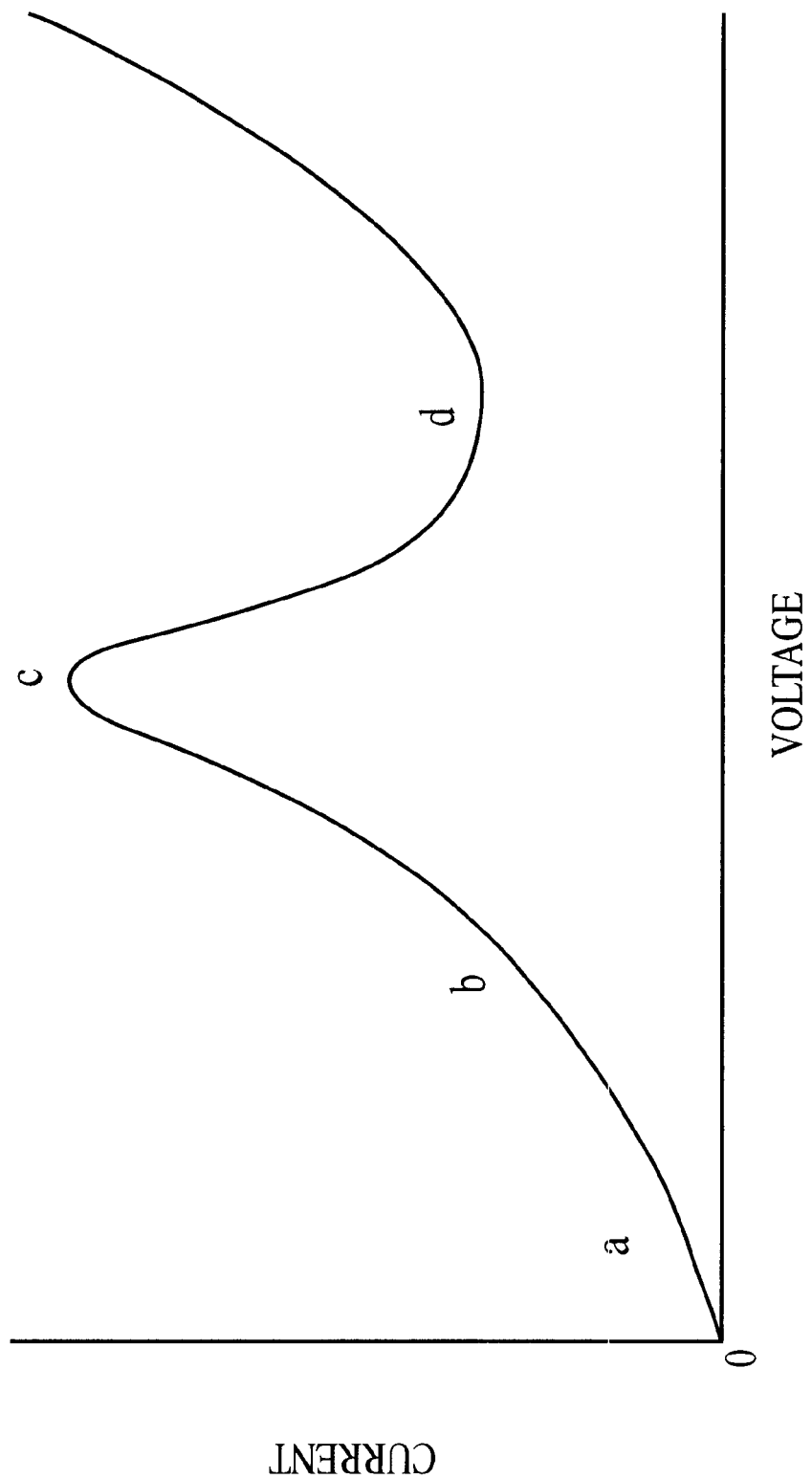
FIG. 2 shows the I-V response for a traditional quantum well switch of FIGS. 1a–1d.

The present invention concerns single electron switches which rely upon elemental silicon nanoparticles for providing a set of discrete levels for electron capture with energy spacing substantially larger than the thermal fluctuation energy to make a switch which is stable at room temperature. The ultrasmall particles of the invention (~1 nm across and uniform with about 1 part per thousand or less of greater dimension) provide the following unique features that are key in the construction of room temperature single electron switches. First, they have a small number of discrete energy states with several electron volt spacing, and the conduction states also from a discrete spectrum. This condition allows stronger coupling to the leads, namely a larger tunneling rate and, consequently, stronger binding of the singlet state, without destroying the discrete nature of the particle spectrum. The more strongly bound singlet state in silicon nanoparticles will withstand thermal agitation at temperatures higher than the very low temperatures required for known single electron switches.

Second, unlike the electron gas case, a silicon nanoparticle provides a system with no population of conduction electrons. Under standard doping levels of~$10^{15}/cm^3$, silicon particles of 1 nm across contain less than one in a million conduction holes or electrons. In other words, the particle behaves as undoped. Practical laboratory temperatures are not sufficient to induce carriers. This condition diminishes or eliminates non-switchable backgrounds.

Finally, particles have to be externally populated. Ultrasmall particles provide extremely small capacitance. Hence, single electron charging is on the order of one electron volt, making it very costly to inject a second electron on the dot. This is ideal for a single electron system. Paired electrons (two or an even number) on the dot form their own singlet states, rendering them inert with regard to interaction with electrons in the leads. Only an odd electron may form the magnetic singlet state responsible for the transparency. The quantization of charge, which is necessary for the Kondo process, may be completely lost in the case of a large number of electrons with strong coupling to the leads. Under these conditions, the number of electrons becomes less well defined. In this case, transport may not be dominated by the magnetic singlet state, rather by the noninteracting electrons.

Colloid silicon nanoparticles were precipitated from a volatile solvent (acetone). The silicon nanoparticles were reconstituted into a thin film on p-type, and n-type Si, and aluminum substrates. The particles have ~/nm dimensions and are uniform with about less than 1 part per thousand exceeding 1 nm. Room temperature electronic transport through the particles has studied, using scanning tunneling microscopy. We probed the conductance of the particles by recording the I-V spectra of the film, using a scanning tunneling microscope, in a two terminal arrangement where the tip acts as the source and the substrate acting as the drain. This configuration is shown in FIG. 3.

Figure 3:
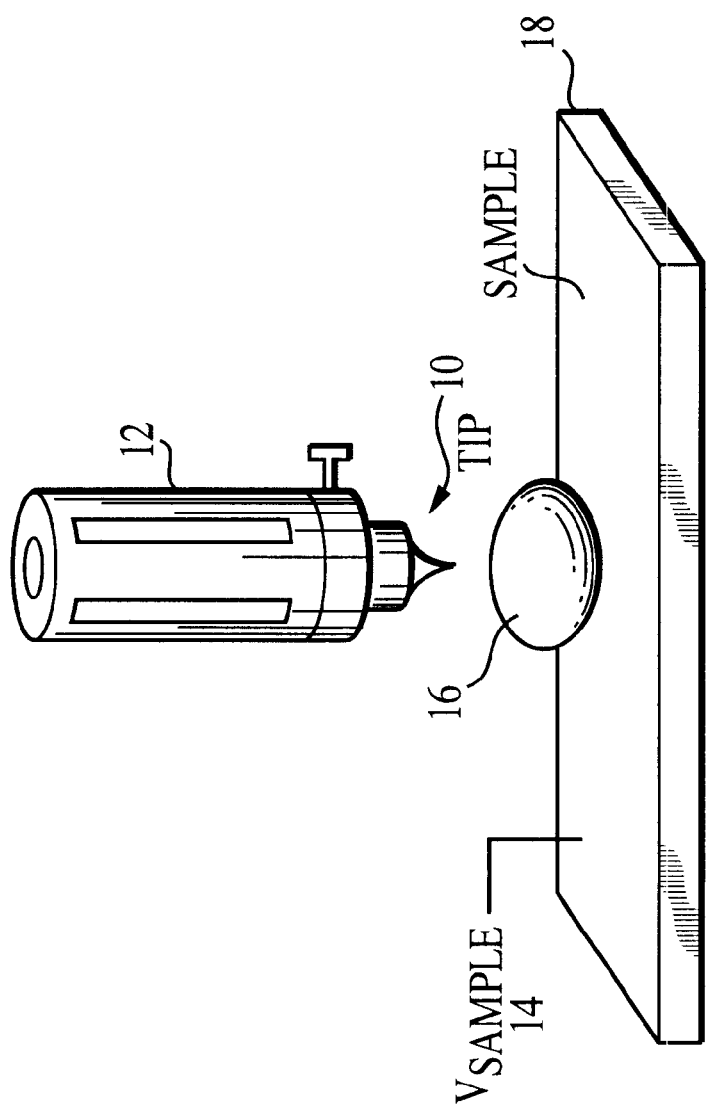
FIG. 3 depicts a prototype configuration for a switch of the invention where the tip of a scanning tunneling microscope (STM) is placed over silicon nanoparticle material at a constant height (a greatly exaggerated illustration of a silicon nanoparticle is shown on the surface of the material in FIG. 3)

In FIG. 3, the tip 10 of a scanning tunneling microscope 12 is placed over the silicon particle film 14 at a constant height. The FIG. 3 representation of the film 14 includes an exaggerated representation of a silicon nanoparticle 16, which, in reality, forms part of the film 14. The film is formed on a substrate 18. In this two-terminal arrangement, the tip 10 acts as one lead (source electrode), while a substrate 18 acts as the other lead (drain electrode). This configuration may be represented by a double barrier model. The particle 16 represents the quantum well (dot), with a vacuum barrier due to a gap between the particle and the tip, and a barrier due to a gap between the particle 16 and the substrate 18. The leads on either side are represented by a sea of electrons with a chemical potential $*=*A=*B$. The dimensions of the switch prototype were chosen as follows.

The particles were deposited on the substrate after a thin oxide of ~1 nm was grown. The tungsten electrode (the tip of microscope) was brought to a certain distance from the particles by control of the tunneling current. The tunneling current was set at 1 nA and the biasing voltage at 3V in a constant current mode, giving a tip height of several angstroms. The feedback loop is then disengaged allowing the tip 10 to be held in a constant height mode at this distance. We took the I-V spectra of the switch. While the voltage of the tip was varied with respect to the (grounded) substrate from −5 to +5 volts, the tunneling current was recorded.

Figure 4:
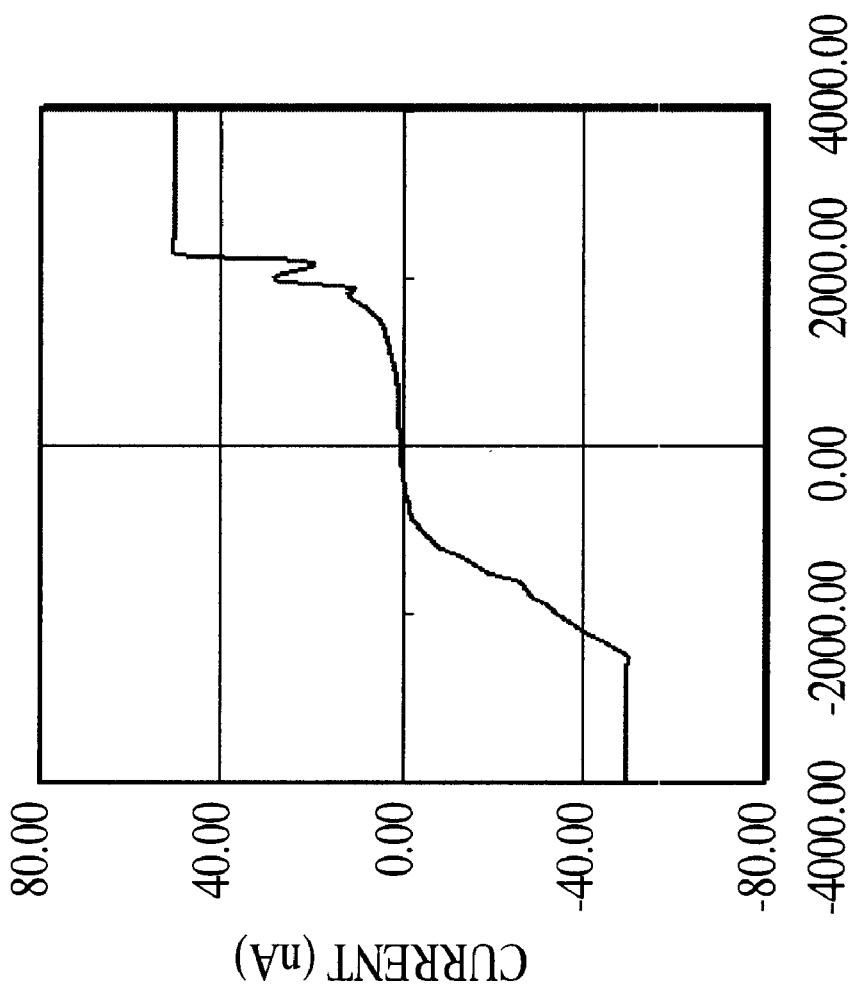
FIG. 4 gives the I-V switching response taken with silicon nanoparticles on an n-type silicon substrate, but without an activation pulse, showing no switching behavior (zero bias voltage conductance with a Coulomb blockade)
Figure 6A:
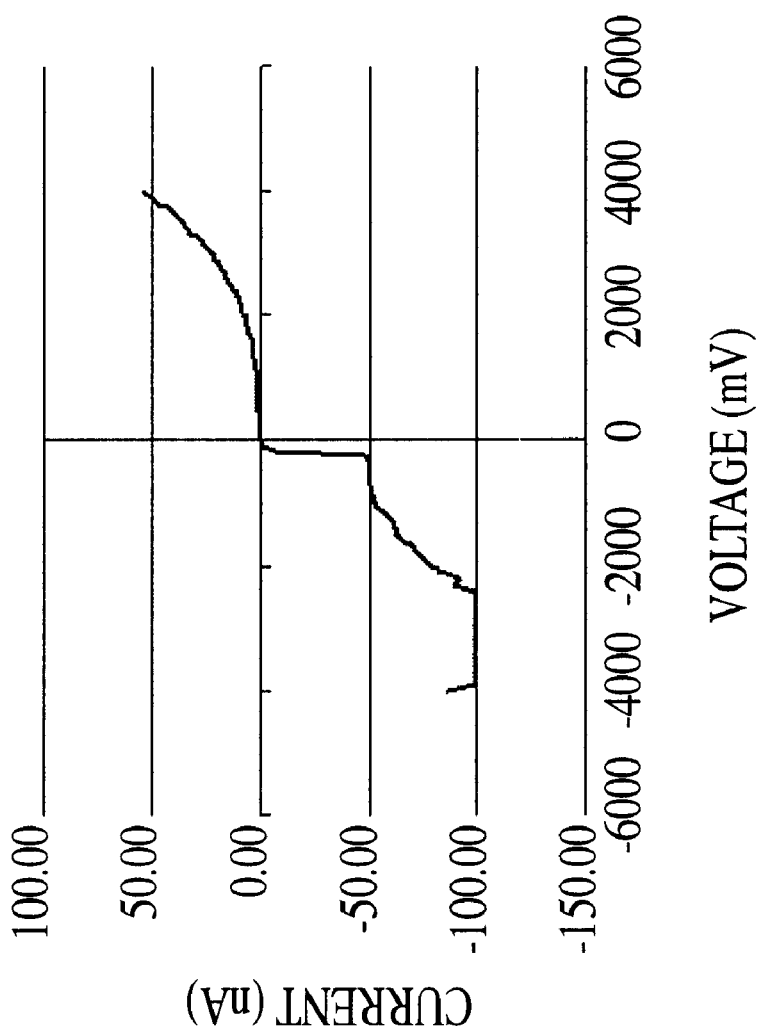
FIG. 6(a) gives the individual I-V response.
Figure 6B:
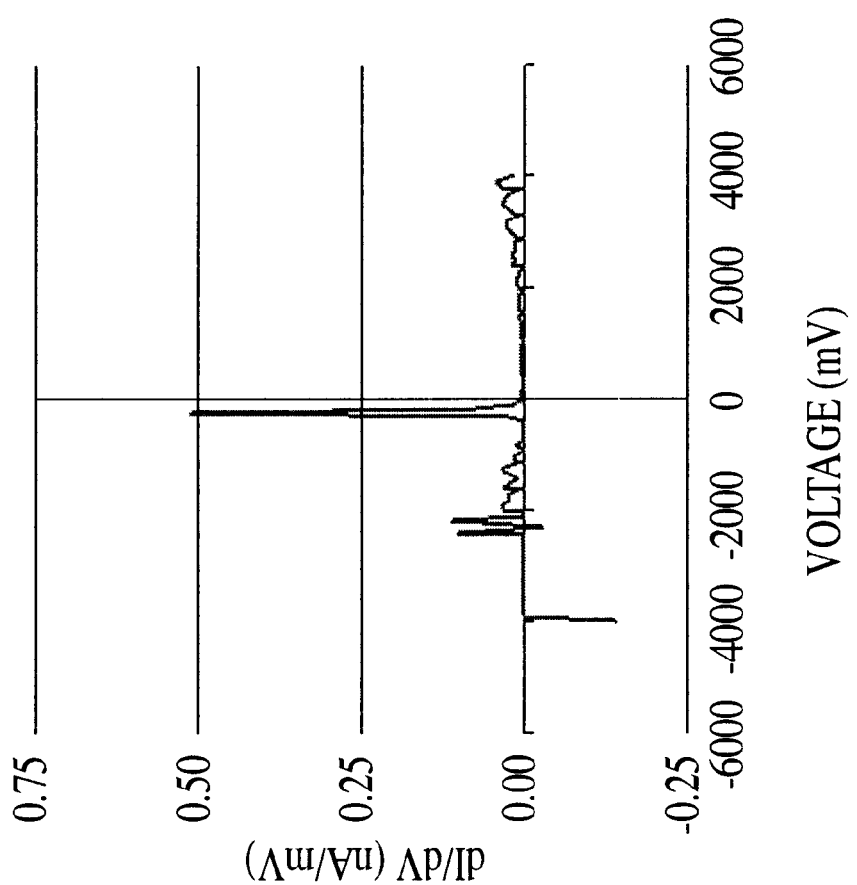
FIG. 6(b) gives the corresponding derivative of the individual I-V spectrum.

We tested the system by replacing the p-type silicon substrate with an n-type silicon substrate. This type, unlike p-type silicon, is rich in free conducting electrons as in metallic leads. FIG. 4 gives the I-V spectra taken with the silicon nanoparticle film being on an n-type silicon substrate. It shows no conductance with a Coulomb blockade. As mentioned above, under standard doping levels, the silicon nanoparticle film behaves as undoped. Practical laboratory temperatures are not sufficient to induce carriers. We need to populate the particle with conduction electrons for the singlet magnetic state to form as described in FIG. 5. Now to populate the dot with a single electron, the dot is biased first by a voltage pulse in the range of approximately 3 to 5 Volts from a pulse generator. The generator is externally connected to the tip 10. FIG. 6a gives the individual I-V response after the application of the voltage pulse. It shows that the Coulomb blockade has been lifted and it shows quite visibly high conduction at zero biasing where the current jumps by several tens of nA. FIG. 6b gives the corresponding derivative of the individual I-V spectrum, showing the sharp peak of conduction. This is unlike the p-type substrate, where the conductance and its differential showed no measurable value at zero biasing, under all cases of pulsing to populate the particle.

The size of the differential conductance measured in the experiments approaches $6\times10^{-6}$ A/V. This is consistent, i.e., less than the expected value for a full transparency due to a single electron $2e^2/h=6\times10^{-5}$ A/V. The drop may be due to an asymmetry in the connection to the leads, i.e., leads have different tunneling rates to the particle If *1 * *2. This is consistent with a single electron and a single particle participating. In some cases we observe multiples of this value, which may indicate the participation of more than one particles in parallel with a single electron conduction.

Figure 7:
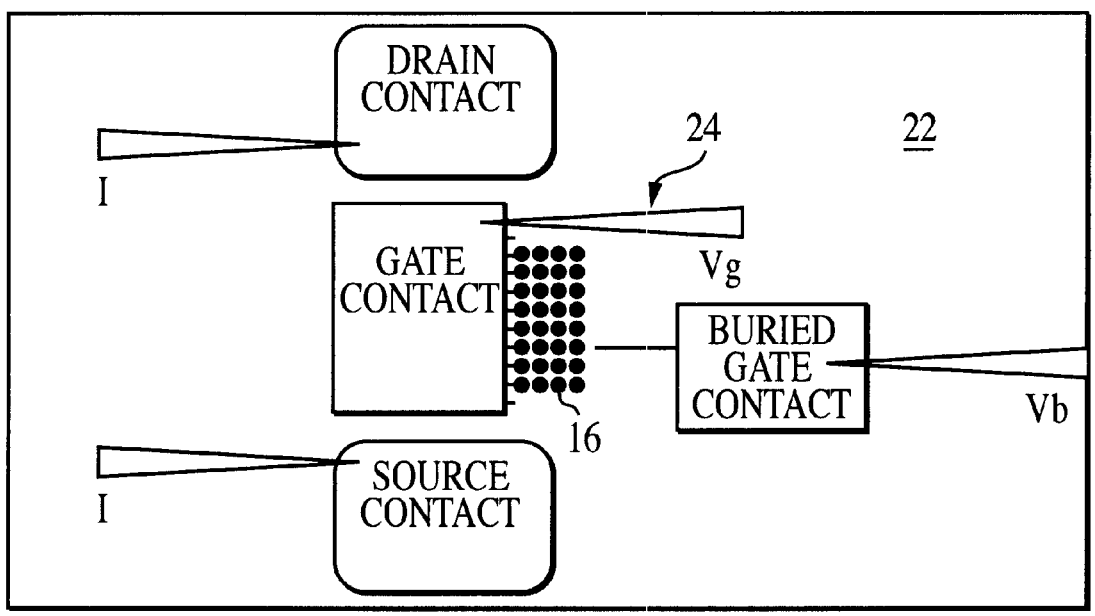
FIG. 7 schematically illustrates a switch of the invention realized as a MOSFET device.

In a practical device, the tip of the STM would be replaced by a conducting flat electrode (metal for example). Thus, the particles will effectively be sandwiched between the n-type silicon electrode and the metal electrode. In another geometry, the n-type substrate may also be replaced by a metal flat. An exemplary practical configuration is the MOSFET transistor shown in FIG. 7. In this case the particles 16 will be planted in its body 20, with the substrate 22 constituting one electrode and the gate 24 constituting the other.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. An electronic switch, the switch comprising a pair of electrodes, and a film of uniform silicon nanoparticles between the pair of electrodes, the silicon nanoparticles dimensioned of approximately one nanometer with about one part per thousand being dimensioned greater than 1 nm.

2. The electronic switch according to claim 1, wherein the switch is responsive to a voltage differentiation of approximately 3 to 5 eV between the pair of electrodes.

3. The electronic switch according to claim 1, wherein said pair of electrodes comprise an n-type semiconductor electrode and a metal electrode.

4. The electronic switch according to claim 1, formed as a MOSFET, wherein said pair of electrodes comprise a gate of the MOSFET and a substrate of the MOSFET, the silicon nanoparticles being deposited in a body of the MOSFET between the gate and the substrate.

5. The electronic switch according to claim 1, wherein said pair of electrodes comprise a tip of an STM and an n-type substrate upon which said film of silicon nanoparticles is formed.

* * * * *

UNITED STATES PATENT AND TRADEMARK OFFICE
CERTIFICATE OF CORRECTION

PATENT NO. : 6,410,934 B1  
DATED : June 25, 2002  
INVENTOR(S) : Nayfeh et al.

It is certified that error appears in the above-identified patent and that said Letters Patent is hereby corrected as shown below:

Column 1,  
Line 52, delete "1b" and insert -- 1d --

Signed and Sealed this

Eighteenth Day of February, 2003

JAMES E. ROGAN  
*Director of the United States Patent and Trademark Office*